United States Patent [19]

Gobbi et al.

[11] Patent Number: 5,117,127
[45] Date of Patent: May 26, 1992

[54] CUSTOMIZABLE LOGIC INTEGRATED CIRCUIT WITH MULTIPLE-DRAIN TRANSISTOR FOR ADJUSTING SWITCHING SPEED

[75] Inventors: José M. Gobbi, Paris; Louis Le Berre, Les Ults, both of France

[73] Assignee: Thomson Composants Microondes, Puteaux, France

[21] Appl. No.: 589,626

[22] Filed: Sep. 28, 1990

[30] Foreign Application Priority Data

Oct. 17, 1989 [FR] France ............... 89 13536

[51] Int. Cl.⁵ ......................................... H03K 19/017
[52] U.S. Cl. ................................... 307/443; 307/448; 307/299.1
[58] Field of Search .............. 307/443, 448, 450, 465, 307/477, 591, 594, 597, 299.1, 304

[56] References Cited

U.S. PATENT DOCUMENTS

| | | | |
|---|---|---|---|
| 4,485,316 | 11/1984 | Nuzillat et al. | 307/450 X |
| 4,680,484 | 7/1987 | Saunders | 307/448 |
| 4,831,286 | 5/1989 | Garcia et al. | 307/450 X |
| 4,879,683 | 11/1989 | Garcia | 307/450 X |
| 4,954,730 | 9/1990 | Yoh | 307/450 X |
| 4,970,413 | 11/1990 | Eden et al. | 307/448 X |
| 5,027,007 | 6/1991 | LaRue et al. | 307/443 |

FOREIGN PATENT DOCUMENTS 0186940 7/1986 European Pat. Off. .

OTHER PUBLICATIONS

Proceedings of the IEEE, vol. 72, No. 6, Jun. 1984, pp. 670–689, IEEE, N.Y., US; E. T. Lewis: "Optimization of device area and overall delay for CMOS VLSI designs" *FIGS. 2, 3, 15–18; p. 671, line 46—p. 675, line 31; p. 676, line 36—p. 688, line 22*.

Patent Abstracts of Japan, vol. 8, No. 8 (E-221), 13 Jan. 1984; JP-A-58 173 868 (Mitsubishi Denki K.K.) Dec. 10, 1983.

Patent Abstracts of Japan, vol. 4, No. 59 (E-009), 2 May 1980; & JP-A-55 030 287 (Nissan Motor Co., Ltd) Apr. 3, 1980.

Primary Examiner—David Hudspeth
Attorney, Agent, or Firm—Oblon, Spivak, McClelland, Maier & Neustadt

[57] ABSTRACT

Disclosed is a logic integrated circuit for which the time of switching over between two logic states, 0 and 1, is adjustable. In a logic operator such as an inverter, the switch-over time, at the output, is a function of the current put through by the load transistor or by the signal transistor. This time is adjustable, either as rising time or as fall time, by the replacement of at least one single-drain transistor by a multiple-drain transistor, the throughput rate of which is fixed by the number of connected drains. The disclosed device can be applied to pre-diffused (Si) circuits or pre-implanted (GaAs) circuits.

6 Claims, 3 Drawing Sheets

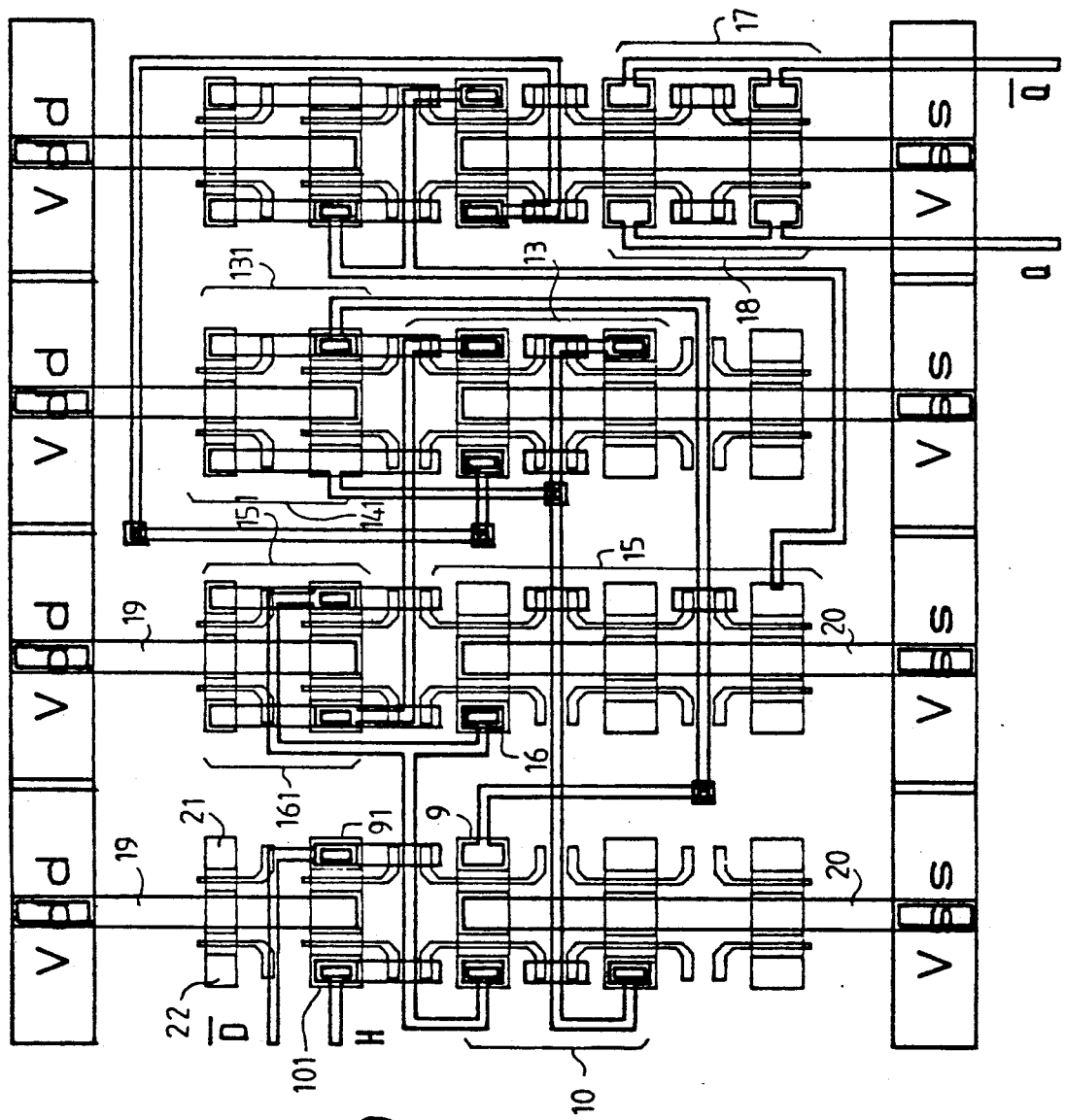
FIG_9

CUSTOMIZABLE LOGIC INTEGRATED CIRCUIT WITH MULTIPLE-DRAIN TRANSISTOR FOR ADJUSTING SWITCHING SPEED

BACKGROUND OF THE INVENTION

1. Field of the Invention

The present invention concerns a pre-diffused or pre-implanted logic circuit wherein the speed of change between two logic states, 0 and 1, can be adjusted or set by a choice of components, made during the metallization that customizes this pre-diffused or pre-implanted circuit.

2. Description of the Prior Art

Customizable circuits are circuits that include a plurality of discrete components (diodes, transistors etc.) or elementary functions (logic operators, inverters etc.) that are not interconnected: the network of metallic interconnections is deposited when the user has provided his electrical diagram, which personifies this general-purpose circuit. Most usually, only a fraction of the circuits available is used to form the circuit used.

Customizable circuits of this type are called CICs (custom integrated circuits) or, generically, "pre-diffused" circuits, although it is more precise to speak of "pre-implanted" circuits when the circuit is made on GaAs or on materials of the III-V group. The invention concerns pre-diffused circuits on Si or pre-implanted circuits on GaAs.

The pre-implanted components and functions have characteristics, such as their speed, or cut-off frequency, that are set by the technology used: the interconnections that are deposited subsequently cannot change these characteristics, they can only group together existing components or leave aside unused components. Consequently, the circuits made have performance characteristics equal to that of the discrete components and the elementary functions that form them, and these performance characteristics are fixed by the technology used.

SUMMARY OF THE INVENTION

The invention enables the making of pre-diffused or pre-implanted logic integrated circuits, wherein the speeds of switching over between two logic states, from logic 0 to logic 1 or vice versa, are adjustable. This result is obtained by means of multiple-drain transistors, which are equivalent to a plurality of parallel-mounted transistors, supplied and controlled simultaneously. Since these are pre-diffused or pre-implanted circuits, the number and position of the transistors that are used during the final metallization of the customizable circuit enables the modification of either the speed of switching over from logic 0 to logic 1 (rising front) or the speed of switching over from logic 1 to logic 0 (descending front), or both simultaneously. Indeed, it may be considered that, for a given logic stage, the following stage of the logic circuit is equivalent to a capacitor, to be loaded or discharged. The speed of the loading or discharging of this capacitor can be modified by the parallel-mounting of a variable number of transistors that give or absorb a current proportionate to the number of parallel-mounted transistors (assuming that they all have the same dimensions).

More precisely, the invention concerns a logic integrated circuit comprising at least one logic operator, the output of which gives a logic signal, 0 or 1, complementary to the customizable logic signal, 1 or 0, applied to its input, wherein said integrated circuit includes at least one multiple-drain transistor, in said logic operator, the number of drains connected to the output of the operator making it possible to adjust the time of switching over from a first logic state to a second logic state.

BRIEF DESCRIPTION OF THE DRAWINGS

The invention will be understood more clearly from the more detailed description that now follows, made with reference to the appended drawings, of which:

FIG. 9 shows an example of the layout of a D-type flip-flop, constituted by multiple-drain transistors, according to the invention.

DETAILED DESCRIPTION OF THE INVENTION

Figure 1:
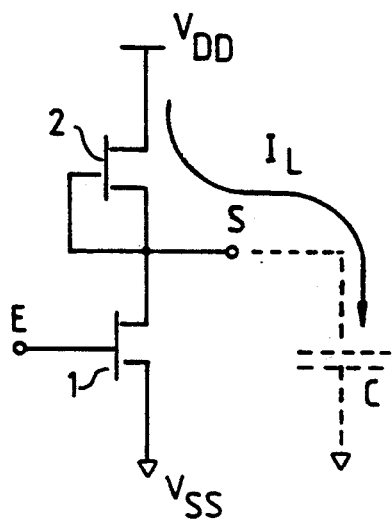
FIGS. 1 and 2 are diagrams showing the loading and discharging respectively of a circuit mounted at the output of an inverter, according to the prior art.

Let us consider an elementary inverter circuit such as the one shown in FIG. 1: this type of circuit forms the basis of logic circuits. It is constituted by a transistor 1, the gate of which forms the input of the inverter, said transistor being loaded by a transistor 2: the two transistors are series-mounted between a current source $V_{DD}$ and a current source $V_{SS}$ which is often the ground. The point common to the two transistors forms the output S, connected to a following stage of the logic circuit.

The following stage may be likened to an equivalent capacitor C, shown by means of dashes. The inverter works all the faster as it is capable of loading or discharging the equivalent capacitor C with greater speed.

The change from the logic state 0 to the logic state 1 corresponds to the loading of the capacitor C by a current $I_L$, represented in FIG. 1 by an arrow: this load current is controlled by the load transistor 2. The greater the transistor 2, the greater is the current $I_L$ and, accordingly, the faster the rising time from logic 0 to logic 1.

Figure 2:
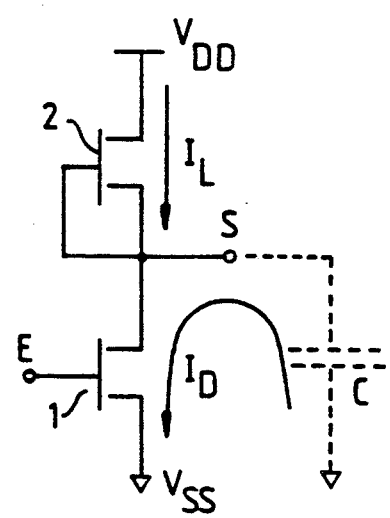

Reciprocally, in FIG. 2, the change from the logic state 1 to the logic state 0 corresponds to the discharging of the capacitor C. The discharging current $I_D$ goes through the signal transistor 1, which also draws the current $I_L$ that the load transistor 2 continues to provide. The greater the transistor 1, the faster the current $I_D$ is discharged and, accordingly, the faster is the fall time from logic 1 to logic 0.

Figure 3:
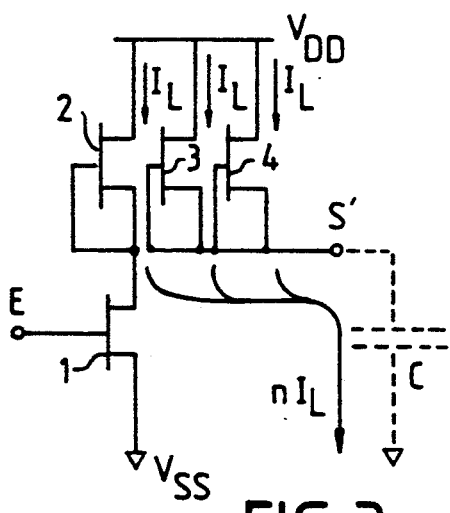
FIGS. 3 and 4 are diagrams showing the loading and discharging, respectively, of a circuit mounted as an output of an inverter, according to the invention.
Figure 4:
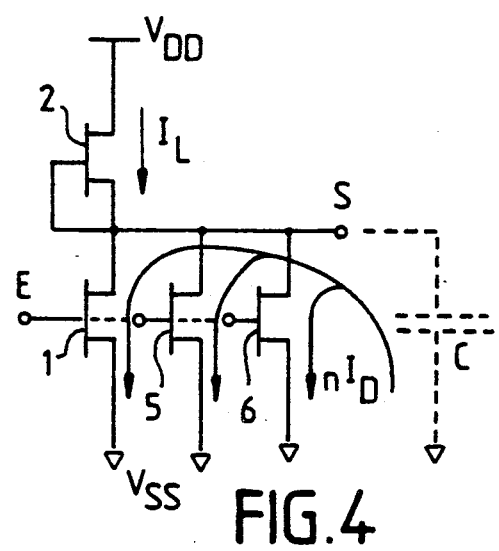

According to the invention, the time taken by an inverter for switching over from logic 0 to logic 1 and vice versa may be modified and accelerated by the parallel-mounting of a plurality of transistors, as shown in FIGS. 3 and 4.

In the same way, in FIG. 4, the fall time from 1 to 0 is improved by means of a plurality of transistors such as 5 and 6, parallel-mounted with the signal transistor 1 and controlled simultaneously by the input signal E.

Thus it is possible, by the parallel-connection of one or more transistors with the two transistors of an inverter, to modify, as desired, the rising speed or the falling speed between the two positions, logic 0 and logic 1. This operation for the adjustment of characteristics is particularly easy with pre-diffused customizable circuits in which it suffices to adapt the final metallization mask to choose the number of parallel-mounted transistors.

However, instead of the parallel mounting of a plurality of transistors with as many sources, gates and drains, it is advantageous to use multiple-drain transistors, which are known.

Figure 5:
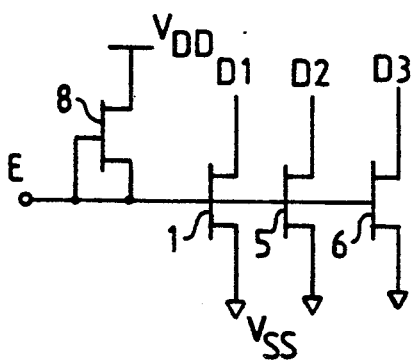
FIG. 5 is an equivalent circuit diagram of a multiple-drain operator, according to the invention.

A multiple-drain transistor is shown in the right-hand part of FIG. 5, and its equivalent circuit diagram is shown in the left-hand part. The enhanced multiple-drain transistor 7 has only one source connected to $V_{SS}$ and only one gate which controls several drains $D_1$, $D_2$, $D_3$, ..., equivalent to several elementary transistors such as 1, 5, 6, for example. A depleted transistor 8, connected between $V_{DD}$ and the gate of the transistor 7, forms an injector of current into the multiple-drain transistor.

Let us now consider a logic circuit including a succession of inverter stages or DCFL operators: the output of the first stage, on the drain of the transistor 1, is applied to the gate of the input transistor of the second stage. Consequently, the load transistor 2 of the first stage may, by a diagrammatical equivalence, be connected to the gate of the input transistor of the second stage, and the multiple-drain transistor 7+8, shown in FIG. 5, is really equivalent to an inverter logic operator, the load transistor of which is shifted by one row in a succession of operators.

Figure 6:
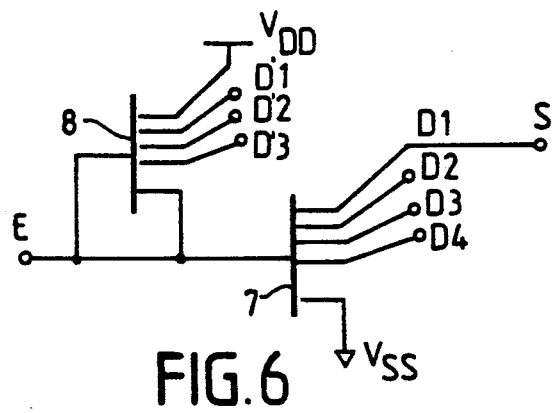
FIG. 6 is a diagram of a logic circuit including two multiple-drain transistors, according to the invention.

FIG. 6 shows a logic circuit according to the invention. It is formed by an enhanced multiple-drain transistor 7, supplied at its gate by another depleted multiple-drain transistor 8. According to what has been explained, the speeds at which this circuit of the invention switches over from a first logic state to a second logic state are adjustable, when this circuit is being customized, by the metallization of a variable number of drains. The speed of switching over from logic 0 to logic 1 is all the higher as more drains $D'_1$, $D'_2$, $D'_3$ ... are connected to $V_{DD}$. The speed of switching over from logic 0 to logic 1 is all the higher as more drains $D'_1$, $D'_2$, $D'_3$ ... are connected to the following stage.

Figure 7:
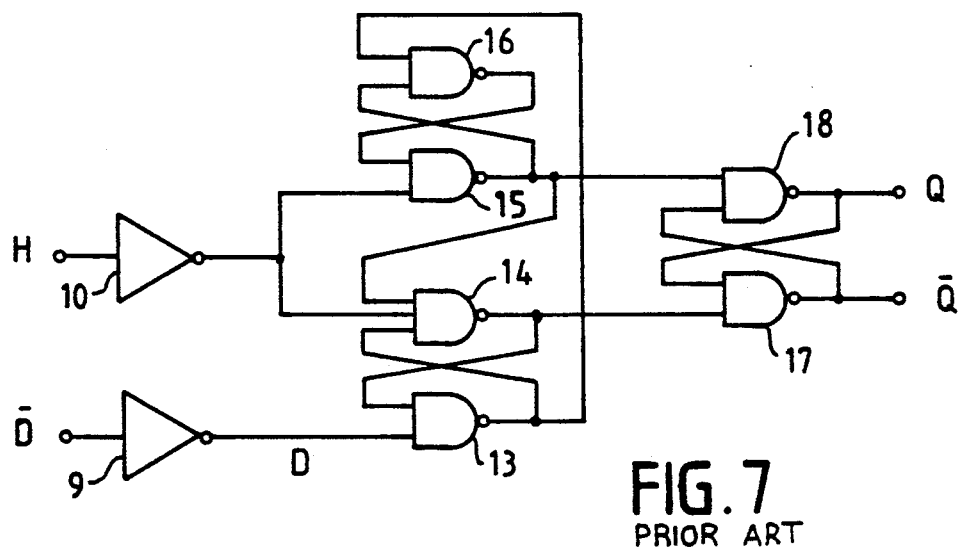
FIG. 7 is an electrical diagram of a D-type flip-flop according to the prior art.

An exemplary application is given by a D-type flip-flop, the simplified logic diagram of which, according to the prior art, is shown in FIG. 7. The data input D and the clock input H are applied to the two inverters 9 and 10. Six NAND operators 13 to 18 process the signals in a known way, and deliver the complementary signals Q and $\bar{Q}$ at the outputs.

Figure 8:
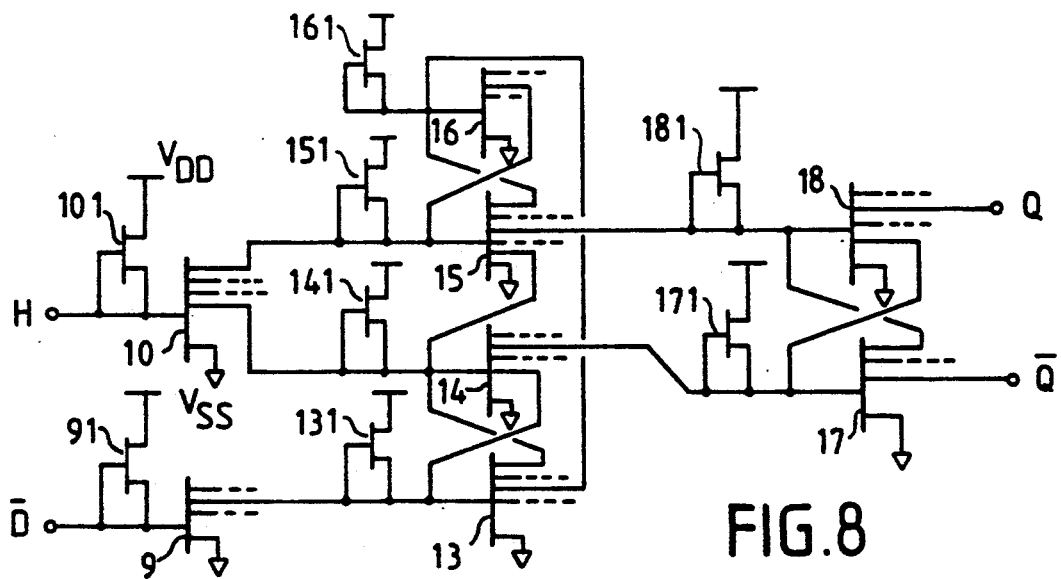
FIG. 8 is an electrical diagram of a D-type flip-flop, constituted by multiple-drains transistors, according to the invention.

The simplified diagram of this D-type flip-flop, made by means of multiple-drain transistors, is shown in FIG. 8. The same references as in FIG. 7 are kept to identify the same NOT and NAND operators, and the current injection transistors repeat the reference of the corresponding multiple-drain transistor with the addition of the suffix "1".

The multiple-drain transistors 10 and 13 to 18 are provided with drains extended by a line of dashes: this convention symbolizes the possibility for the designer of connecting several drains in parallel to adjust the speed of switching over of an operator. For example, by means of suitable metallizations on the pre-diffused circuit, the multiple-drain transistor could have a plurality of drains connected to the transistor 15, and a plurality of drains connected to the transistor 14.

To reduce the length of the interconnections, and derive advantage from a pre-existing organization in the pre-diffused circuit, the multiple-drain transistors are laid out in a so-called "totem" structure shown in FIG. 9. The transistors are assembled in groups of columns and rows that facilitate the interconnection by straight strips of metallizations.

The input connection of an operator may be longer than the other input connections of the other operators: it has more stray capacitances, and in order not to put this operator at a disadvantage with respect to the others, its load transistor should be greater. In integrated circuits, even pre-diffused ones, it is impossible to achieve a continual variation in the dimensions of the load transistors, but it is possible to modify their performance characteristics by the choice of the number of drains that are metallized when the circuit is being customized.

The choice of the combinations of the load transistor makes it possible to modulate the speed of switching over from logic 0 to logic 1, without affecting the fall time from logic 1 to logic 0, by the parallel connection of a plurality of drains: the outputs Q and $\bar{Q}$, at the bottom right-hand corner of FIG. 9, show an example of this.

In this figure, the metallization that provides the supply voltage $V_{DD}$ is at the top of the figure, and the metallization that provides the voltage $V_{SS}$ is at the bottom: from these metallizations, there go out the branchings 19 that cover all the pre-diffused drains of the load transistor, and the branchings 20 that cover all the sources of the signal transistors. The "totem" organization in two columns on either side of the polarization buses 19 and 20 favors density of integration.

By comparison with FIG. 8, it is recognized that the input signal D is applied to the gate of the single-drain transistor 9; the current injector 91 too is simple, but it would have been possible, if necessary, to add the transistor 21, which is unused, to it. The input signal H, with current injection by the transistor 101 (the transistor 22 is unused) is applied to the transistor 10 with two drains. In a first drain, for a transistor 15 with three drains, a load transistor 151 has been chosen. This load transistor 151 groups together two pre-diffused transistors. This is also the case for the transistor 14 with two drains. Continuing the comparison in sequence, it will be recognized that this layout diagram corresponds to the electrical diagram of the D-type flip-flop of FIG. 8, but with the possibility of causing variation in the currents in the multiple-drain transistors, hence in the speeds of switching over between the logic states 0 and 1.

The invention has been explained with reference to the example of an inverter, with application to a D-type flip-flop, but it is clear that it more generally concerns logic circuits, for which the use of multiple-drain transistors enables the modulation of the speeds of switching over between two logic states, using metallizations for customizing the pre-diffused and pre-implanted circuits.

What is claimed is:

1. A customizable logic integrated circuit comprising; means for supplying two current sources ($V_{DD}$, $V_{SS}$); at least one inverter logic operator wherein at least one multiple-drain transistor is connected between an output of said inverter logic operator and at least one of the current sources ($V_{DD}$, $V_{SS}$) for adjusting the speed at which said logic operator switches over between two logic states wherein at least a portion of the switch-over speed is adjusted or set by the number of drains connected to said current source.

2. A logic integrated circuit according to claim 1 wherein, said logic operator comprises:
   a signal transistor, the gate of which forms the input and the drain of which forms the output, and by a load transistor;
   a multiple-drain transistor, mounted as a load transistor for altering the time needed by said logic operator to switch from a logic state "0" to a logic state "1".

3. A logic integrated circuit according to claim 1 wherein, said logic operator comprises:
   a signal transistor, the gate of which forms the input and the drain of which forms the output, and by a load transistor;
   a multiple-drain transistor mounted as a signal transistor for altering the time needed by said logic operator to switch from a logic state "1" to a logic state "0".

4. A logic integrated circuit according to claim 1 wherein, the speed of the switching over between two logic states being a function of the current put through by the logic operator, the switch-over speed is adjusted by the number of drains connected together in the multiple-drain transistor.

5. A logic integrated circuit according to claim 1, wherein said integrated circuit is formed from a pre-diffused (Si) or pre-implanted (GaAs) integrated circuit, wherein the number of drains used in a multiple-drain circuit is determined by the metallization for customizing the pre-diffused or pre-implanted circuit.

6. A logic integrated circuit according to claim 5, wherein the transistors forming the pre-diffused or pre-implanted circuit are arranged according to a so-called "totem" architecture, in columns and rows, the customizing metallization being formed by rectilinear segments deposited between the columns and the rows of transistors.

* * * * *